United States Patent [19]

Kohyama

[11] Patent Number: 5,281,837
[45] Date of Patent: Jan. 25, 1994

[54] SEMICONDUCTOR MEMORY DEVICE HAVING CROSS-POINT DRAM CELL STRUCTURE

[75] Inventor: Yusuke Kohyama, Kawasaki, Japan
[73] Assignee: Kabushiki Kaisha Toshiba, Kawasaki, Japan
[21] Appl. No.: 704,953
[22] Filed: May 23, 1991
[30] Foreign Application Priority Data
  May 28, 1990 [JP] Japan .................. 2-137335
[51] Int. Cl.$^5$ .................. H01L 27/108; H01L 29/76; H01L 29/94; G11C 11/24
[52] U.S. Cl. .................. 257/296; 257/301; 257/302; 257/310; 257/379; 365/149; 365/182
[58] Field of Search .............. 365/149, 182; 357/23.6, 357/23.6 G; 257/301, 302, 310, 296, 303, 306, 379, 532

[56] References Cited

U.S. PATENT DOCUMENTS

| | | | |
|---|---|---|---|
| 3,305,394 | 2/1967 | Kaiser et al. | 361/313 |
| 4,630,088 | 12/1986 | Ogura et al. | 365/149 |
| 4,882,649 | 11/1989 | Chen et al. | 361/313 |
| 4,970,564 | 11/1990 | Kimura et al. | 257/310 |
| 4,974,060 | 11/1990 | Ogasawara | 357/23.6 G |
| 4,984,038 | 1/1991 | Sunami et al. | 357/23.6 G |
| 5,136,534 | 8/1992 | McDavid et al. | 357/23.6 |

FOREIGN PATENT DOCUMENTS

| | | | |
|---|---|---|---|
| 63-172458 | 7/1988 | Japan | 365/149 |
| 64-25461 | 1/1989 | Japan | 357/23.6 G |
| 64-25462 | 1/1989 | Japan | 357/23.6 G |
| 64-25466 | 1/1989 | Japan | 357/23.6 G |
| 1-91449 | 4/1989 | Japan | 365/149 |
| 1-91450 | 4/1989 | Japan | 365/149 |
| 1-307260 | 12/1989 | Japan | 257/302 |
| 2-159058 | 6/1990 | Japan | 365/149 |

Primary Examiner—William Mintel
Assistant Examiner—Steven Loke
Attorney, Agent, or Firm—Banner, Birch, McKie & Beckett

[57] ABSTRACT

For providing a semiconductor memory device that includes a plurality of cross-point memory cells each having a fine device structure and a high capacitance, a bit line is formed on an insulating substrate, and a word line is disposed above the substrate so as to cross the bit line. A MOS transistor with a vertical structure, whose gate electrode is used as the word line, is provided on the bit line. A MIM (Metal-Insulator-Metal) capacitor is provided on the MOS transistor.

11 Claims, 5 Drawing Sheets

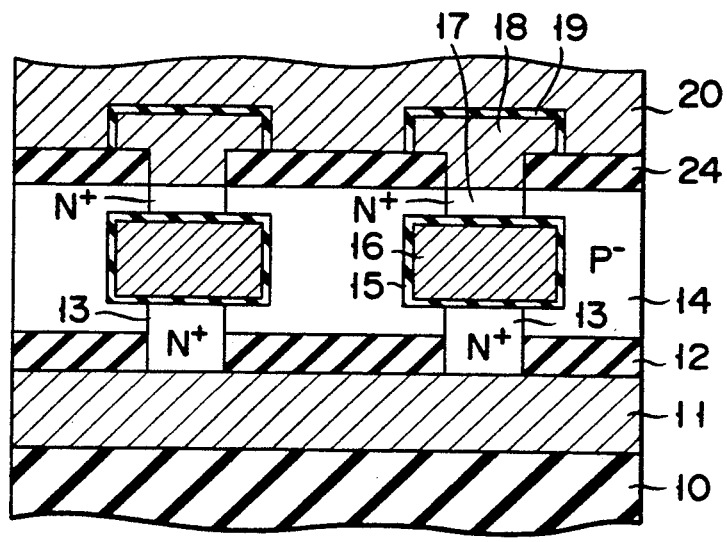
F I G. 1B
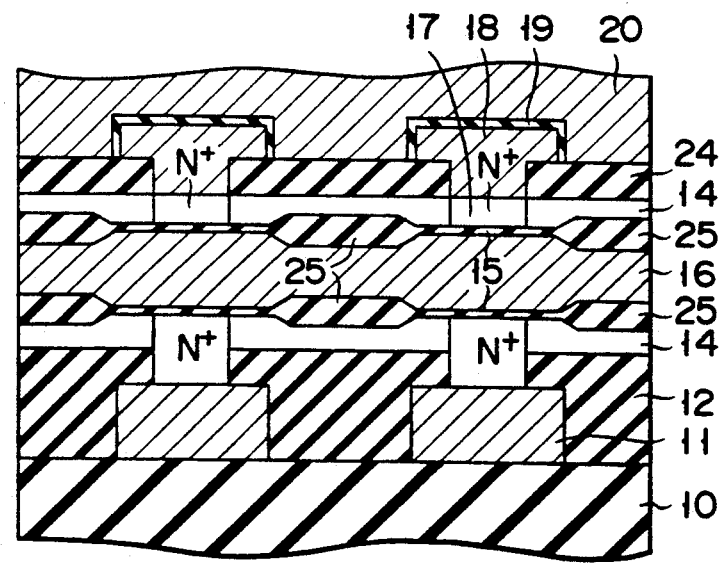
F I G. 1C

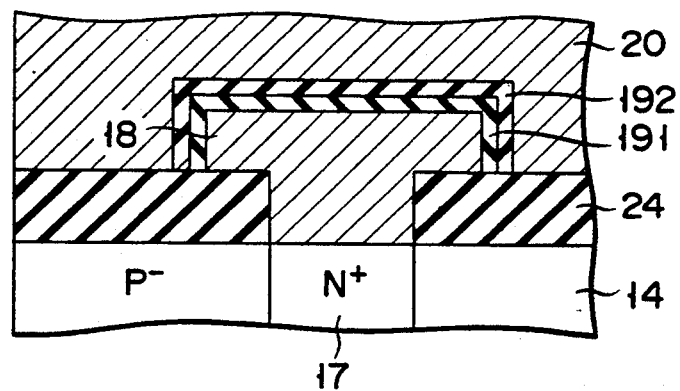
F I G. 3A
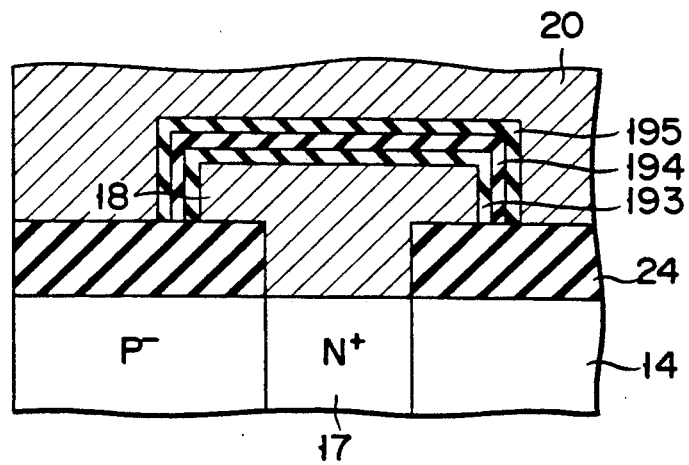
F I G. 3B

SEMICONDUCTOR MEMORY DEVICE HAVING CROSS-POINT DRAM CELL STRUCTURE

BACKGROUND OF THE INVENTION

1. Field of the Invention

The present invention relates to a semiconductor memory device, and more particularly, to a semiconductor memory device having cross-point DRAM cells.

2. Description of the Related Art

In recent years, the integration density of DRAMs (Dynamic Random Access Memories) has been increased. As the integration density is increased, a capacitor area is reduced. Therefore, the contents of the memory may be erroneously read out, and data may be also broken by radiation.

In order to eliminate the above problems, capacitors having various structures have been proposed. As one of the structures, a conventional stacked capacitor cell structure is shown in FIG. 4. In FIG. 4, reference numeral 30 denotes a semiconductor substrate; 31, a field oxide film for isolation selectively formed on the substrate surface; 32, a gate oxide film formed on the substrate surface; 33, a gate electrode (word line) of a transfer-gate MOS transistor; and 34, the source/drain regions of the MOS transistor, respectively. The MOS transistor thus isolated is covered with a first insulating film 35. A first contact hole is formed in the first insulating film 35, through which a lower capacitor electrode (storage node electrode) is provided so as to be in contact with on of the source/drain regions 34 of the MOS transistor, and an upper capacitor electrode (cell plate electrode) 38 is disposed above the lower capacitor electrode 36 through an insulating film 37 to provide an MIM (metal-insulator-metal) capacitor, which includes the lower capacitor electrode 36, the insulating film 37 and the upper capacitor electrode 38. The MIM capacitor formed as described above is covered with a second insulating film 39, in which a second contact hole is formed. A bit line 40 is provided so as to be in contact with the other of the source/drain regions 34 of the MOS transistor through the second contact hole.

Although the MIM capacitor region has a three-dimensional structure, the stacked capacitor cell has a large occupied area given by the isolation region, the MOS transistor region, the bit line contact region, and spacings thereamong. Therefore, it may be difficult to provide a memory cell having hyperfine geometry structure. Even in a trench capacitor cell, the same disadvantages as described above cannot be avoided.

In Published Examined Japanese Patent Application Nos. 64-25461, 64-25462, and 64-25466, as shown in FIG. 5, a memory cell having a vertical MOS transistor structure is described. The memory cell is provided as follows. A trench 42 is formed in an N-type semiconductor substrate 40 having a P+-type semiconductor layer 41, and a dielectric film (e.g., SiO₂ film) is formed on the inner surface of the trench as an insulating film 43. Thereafter, and an N+-type charge storage electrode 44 is provided. A word line (gate electrode) 45 and a gate oxide film 46 surrounding the periphery of the word line 45 are provided on the upper surface of the charge storage electrode 44, and a P-type semiconductor layer 47 is provided so as to bury the gate oxide film 46. An insulating film 48 is formed on the upper surfaces of the gate oxide film 46 and the p-type semiconductor layer 47. A contact hole is formed in the insulating film 48, and an N+-type semiconductor layer 49 is deposited in the contact hole. In addition, a conductive film (e.g., polysilicon film) is deposited on the entire surface of the substrate to be in contact with the N+-type semiconductor layer 49. Thereafter, the conductive film is patterned to provide a bit line 50.

In the memory cell that includes the trench capacitor provided in the semiconductor substrate and the MOS transistor with the vertical structure located on the trench capacitor, the planar area occupied by the MOS transistor region is decreased. Therefore, a cross-point memory cell in which a memory cell is located at the cross point of the bit line 50 and the word line 45 can be provided.

However, in the above conventional cross-point memory cell, it is difficult to obtain a sufficiently high capacitance of the capacitor as the device structure of the memory cell is reduced. That is, as a method of increasing the capacitance, it may be considered to use a dielectric film (e.g., a Ta₂O₅ film or a PZT film) having a high dielectric constant as an insulating film 43. However, it is difficult to make such a film having the high dielectric constant. For example, it has been known that the properties of the film are remakably degraded by a high temperature heat treatment. On the other hand, it has been required that when the memory cell having the vertical MOS transistor structure is made, a process after forming the capacitor is performed at a low temperature. However, since the word line 45 and the bit line 50 are provided after the formation of the capacitor, it is difficult to reduce the heat treating time or to decrease the temperature of the heat treatment.

SUMMARY OF THE INVENTION

It is, therefore, an object of the present invention to provide a DRAM cell having a fine device structure and a high capacitance.

It is another object of the present invention to provide a semiconductor memory device having a high integration density.

According to an aspect of the present invention, there is provided a semiconductor memory device that includes a plurality of cross-point DRAM cells each having a fine device structure and a high capacitance. The DRAM cell comprises an insulating substrate, a bit line provided on the substrate, a word line disposed above the substrate so as to cross the bit line, a MOS transistor with a vertical structure provided on the bit line, the MOS transistor having a gate electrode used as the word line, and an MIM (Metal-Inslator-Metal) capacitor provided on the MOS transistor.

BRIEF DESCRIPTION OF THE DRAWINGS

The novel and distinctive features of the invention ar set forth in the claims appended to the present application. The invention itself, however, together with further objects and advantages thereof may best be understood by reference to the following description and accompanying drawings, in which:

FIG. 1B is a sectional view showing the memory cell along a line 1B—1B in FIG. 1A;

FIG. 1C is a sectional view showing the memory cell along a line 1C—1C in FIG. 1A;

FIGS. 3A to 3B are sectional views showing a multi-layer insulating structure of an MIM capacitor in the first embodiment of the present invention;

DETAILED DESCRIPTION OF THE PREFERRED EMBODIMENTS

Memory cells of semiconductor memory devices according to the embodiments of the present invention will be described below with reference to the accompanying drawings.

Figure 1A:
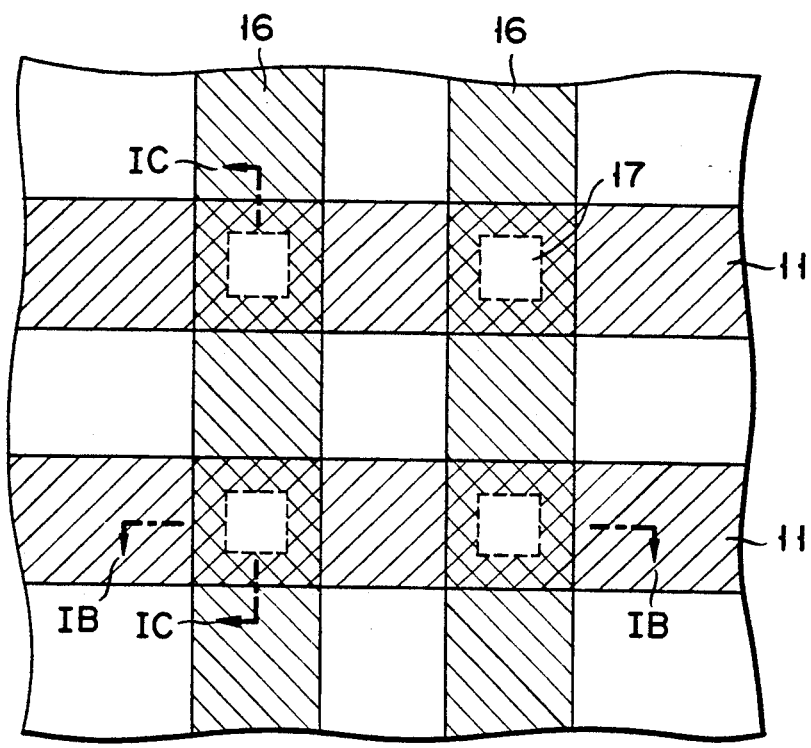
FIG. 1A is a plan view schematically showing a memory cell of a DRAM according to the first embodiment of the present invention.

FIG. 1A is a plan view schematically showing a cross-point memory cell of a DRAM according to the first embodiment of the present invention. FIGS. 1B and 1C are sectional views showing the memory cell along lines 1B—1B and 1C—1C in FIG. 1A, respectively. That is, in FIGS. 1A to 1C, reference numeral 10 denotes an insulating substrate (or an insulating layer provided on a semiconductor substrate). A conductive layer (e.g., a polysilicon film) is deposited on the insulating substrate and patterned to provide a bit line 11. An insulating film 12 is formed on the entire surfaces of the bit line 11 and the insulating layer substrate 10, and a first bit line contact hole is formed in the first insulating film 12. An N+-type epitaxial layer 13 is formed on the bit line through the bit line contact hole. A P−-type epitaxial layer 14 is formed on the first insulating film 12. In this case, the N+-type epitaxial layer 13 serves as one region (N+-type diffused layer) of source/drain regions of a MOS transistor for transfer gate. A word line (a gate electrode of the MOS transistor) 16 covered with a gate insulating film 15 is provided on the N+-type epitaxial layer 13. The word line 16 is also disposed in the P−-type epitaxial layer 14. A process for forming the word line 16 covered with the gate insulating film 15 will be described below. First, the gate insulating film 15 is formed on both the N+-type epitaxial layer 13 and the P−-type epitaxial layer 14, and the conductive layer is deposited on the gate insulating film 15 and patterned to form the word line 16. In addition, the gate insulating film 15 is formed on the entire surface of the word line 16, and the gate insulating film 15 is removed except for the upper and side surfaces of the word line 16. In this case, in order to isolate memory cells in the longitudinal direction of the gate electrode, a thick oxide film 25 is formed in the word line 16. Thereafter, P−-type epitaxial layer 14 is deposited above the P−-type epitaxial layer 14 so as to entirely cover the word line 16 with the gate insulating film 15, and a second insulating film 24 is formed thereon. A second contact hole for a storage node is formed in the second insulating film 24 to expose the P−-type epitaxial layer 14. An N-type impurity is selectively introduced into the exposed P−-type epitaxial layer 14 through the second contact hole, thereby providing an N+-type diffused layer 17 serving as the other region of the source/drain regions of the MOS transistor. Note that the channel region of the MOS transistor is formed in the P−-type epitaxial layer 14 along the gate insulating film 15. A conductive layer (e.g., polysilicon film) is deposited on the entire surface of the substrate so as to be in contact with the N+-type diffused layer 17 through the second contact hole. The conductive film is then patterned to provide a lower capacitor electrode (storage node electrode) 18. In addition, a conductive film (e.g., polysilicon film) 20 serving as an upper capacitor electrode (cell plate electrode) is deposited on the lower capacitor electrode 18 through an insulating film 19, thereby providing a MOS capacitor.

As described above, in the cross-point memory cell of the DRAM according to the first embodiment, the bit line 11 is provided on the insulating substrate 10, and the MOS transistor having the vertical structure and the MIM capacitor are sequentially formed on the bit line 11. Since the memory cell is located at the cross point between the bit line 11 and the word line 16, the planar area occupied by the memory cell may be reduced in the same manner as in the conventional cross-point memory cell which includes the MOS transistor with the vertical structure provided on the trench capacitor.

The bit line 11 is provided on the lower portion of the MOS transistor, and the MOS capacitor is stacked on the upper portion of the MOS transistor. Therefore, the bit line 11 and the word line 16 can be formed prior to the formation of the capacitor, and after forming the capacitor, it can be easy to reduce the heat treating time or to decrease the temperature of the heat treatment. A dielectric film (e.g., an $Si_3N_4$ film, a $Ta_2O_5$ film, or a PZT film) having a high dielectric constant can be used as the insulating film 19. Even if the size of the memory cell is reduced, a sufficiently high capacitance can be obtained.

Figure 2:
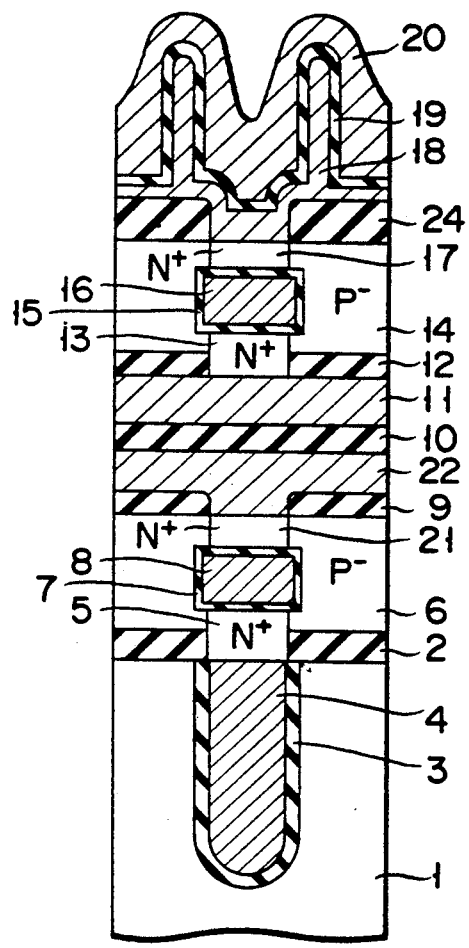
FIG. 2 is sectional view showing a memory cell of a DRAM according to the second embodiment of the present invention.
Figure 4:
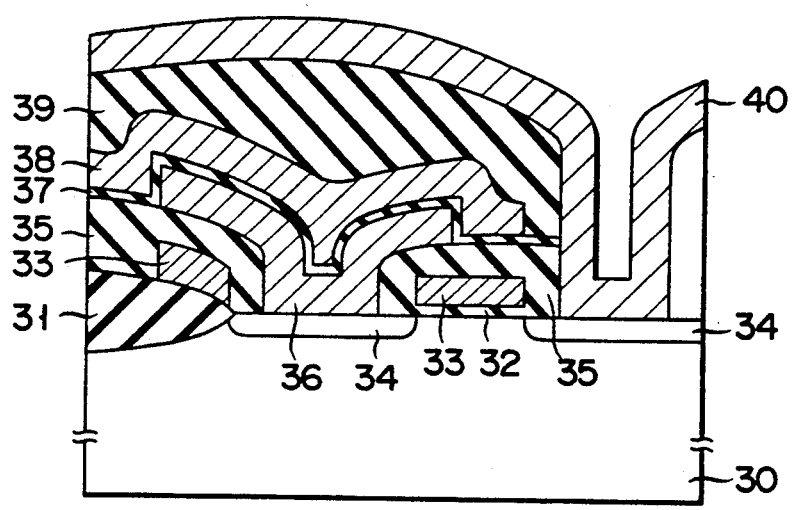
FIG. 4 is a sectional view showing a memory cell of a conventional DRAM.
Figure 5:
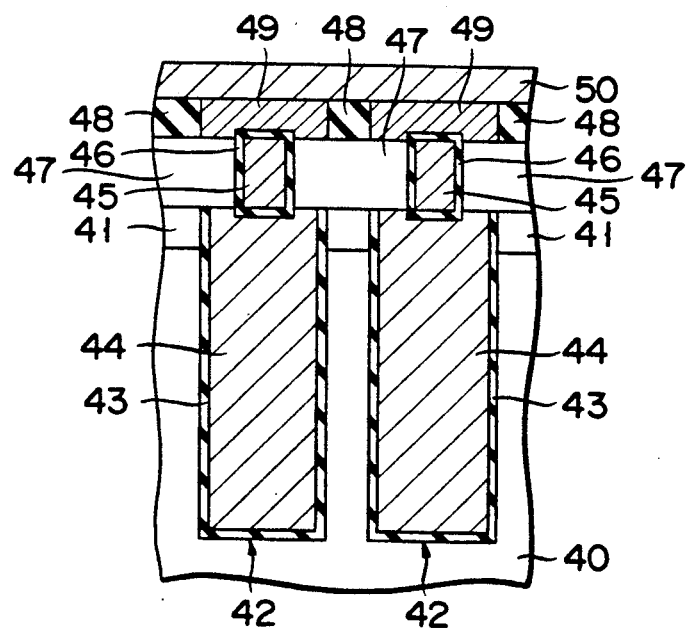
FIG. 5 is a sectional view showing a memory cell of another conventional DRAM.

FIG. 2 shows the sectional structure of a cross-point memory cell of a DRAM according to the second embodiment. In this memory cell structure, a second cross-point memory cell includes a MOS transistor with a vertical structure which is provided on a trench capacitor formed in a semiconductor substrate. The second cross-point memory cell is also disposed under the first cross-point memory cell described in the first embodiment. Two cross-point memory cells are respectively provided at cross points corresponding to two pairs of bit and word lines. The memory cell of the second embodiment is different from the first embodiment in these points, but other structure of the memory cell of the second embodiment is the same as that of the memory cell of the first embodiment. Therefore, the same reference numerals as in FIG. 1B denote the same parts in FIG. 2.

That is, the second cross-point memory cell is formed as follows. After an insulating film 2 is formed on the semiconductor substrate 1, a trench is etched down to the semiconductor substrate 1. An insulating film 3 is formed on the inner surface of the trench, and a conductive layer (charge storage electrode) 4 is provided to bury the trench. An N+-type epitaxial layer (one region of the source/drain regions of the MOS transistor) 5 is grown on the conductive layer 4, and a P−-type epitaxial layer 6 is formed on the insulating film 2 to a desired thickness by an SOI technique. A word line (gate electrode for the MOS transistor) 8 covered with a gate insulating film 7 is provided on the N+-type epitaxial layer 5. In order to isolate memory cells in the longitudinal direction of the gate electrode, a thick oxide film (not shown) is formed on the word line 8. The P−-type epitaxial layer 6 is further grown on the P−-type epitaxial layer 6 so as to bury the word line 8 covered with the gate insulating film 7. The P−-type epitaxial layer 6 is then covered with an insulating film 9. Thereafter, a bit line contact hole is formed in the insulating film 9 to expose the P⁻-type epitaxial layer 6. An N-type impurity is selectively introduced into the exposed P⁻-type epitaxial layer 6 through the contact hole, thereby providing an N⁺-type diffused layer 21 serving as the other region of the source/drain regions of the MOS transistor. In addition, a conductive film (e.g., a polysilicon film) is deposited above the entire surface of the substrate through the contact hole so as to be in contact with the N⁺-type diffused layer 21 serving as the other region of the source/drain regions of the MOS transistor, and the conductive film is patterned to provide a bit line 22.

An insulating film 10 (corresponding to the insulating substrate 10 of the first embodiment) is provided on the second cross-point memory cell described above, and the first cross-point memory cell of the first embodiment is formed on the insulating film (insulating substrate) 10.

As described above, the memory cell of the DRAM according to the second embodiment has the same advantages as those of the memory cell of the DRAM according to the first embodiment.

In the above first and second embodiments, the single insulating film 19 constituted by only, e.g., the SiO$_2$ film is used as the insulating film of the MIM or MOS capacitor stacked on the MOS transistor having the vertical structure. However, as shown in FIGS. 3A and 3B, a multilayer insulating film may be used as the insulating film of the capacitor.

That is, as shown in FIG. 3A, an Si$_3$N$_4$ film 191 and an SiO$_2$ film 192 are formed between a lower capacitor electrode 18 and an upper capacitor electrode 20.

In addition, as shown in FIG. 3B, an SiO$_2$ film 193, an Si$_3$N$_4$ film 194, and an SiO$_2$ film 195 are provided between the lower capacitor electrode 18 and the upper capacitor electrode 20.

As described above, according to the present invention, even if the memory cell has the fine device structure, it is easy to obtain the high capacitance of the capacitor. Therefore, semiconductor memory devices with high integration density will be provided.

It is further understood by those skilled in the art that the foregoing description is preferred embodiments and that various changes and modifications may be made in the invention without departing from the spirit and scope thereof.

What is claimed is:

1. A cross-point memory cell in a semiconductor memory device comprising:
   a substrate;
   a bit line provided on said substrate;
   a first insulating film provided over said substrate to cover said bit line;
   a semiconductor layer provided over said first insulating film to define a MOS transistor, said MOS transistor having source and drain regions and a gate electrode covered with a gate insulating film said gate electrode being used as a word line and crossing said bit line, one of said source and drain regions being coupled to said bit line through a first aperture formed in said first insulating film;
   a second insulating film provided over said semiconductor layer; and
   an MIM capacitor provided on said second insulating film so as to be coupled to the other of said source and drain regions of said MOS transistor through a second aperture formed in said second insulating film.

2. The cross-point memory cell according to claim 1, wherein said word line is buried in said semiconductor layer.

3. A cross-point memory cell in a semiconductor memory device comprising:
   a first memory cell including one conductivity type semiconductor substrate, a trench type capacitor provided in said semiconductor substrate, a first MOS transistor with a vertical structure provided on said trench type capacitor, said first MOS transistor having a first gate electrode used as a first word line, and a first bit line provided on said first MOS transistor, said first bit line crossing said first word line; and
   a second memory cell stacked above said first memory cell through an interlevel insulator, said second memory cell including a second bit line provided on said interlevel insulator, a second word line disposed above said interlevel insulator so as to cross said second bit line, a second MOS transistor with a vertical structure provided on said second bit line, said second MOS transistor having a second gate electrode used as said second word line, and an MIM capacitor provided on said second MOS transistor.

4. The cross point memory cell according to claim 3, wherein said first memory cell is electrically insulated from said second memory cell through said interlevel insulator.

5. The cross point memory cell according to claim 3, wherein said first word line and said second word line extend in a same direction.

6. The cross point memory cell according to claim 3, wherein said first bit line and said second bit line extend in a same direction.

7. The cross point memory cell according to claim 3, wherein said first bit line faces said second bit line through said interlevel insulator.

8. The cross-point memory cell according to claim 3, wherein said MIM capacitor includes a storage node electrode connected to one of source and drain regions of said second MOS transistor, an insulating film covering a surface of said storage node electrode, and a cell plate electrode covering said insulating film.

9. The cross-point memory cell according to claim 8, wherein said insulating film of said MIM capacitor is comprised of an insulating material selected from SiO$_2$, Si$_3$N$_4$, Ta$_2$O$_5$, and PZTs.

10. The cross-point memory cell according to claim 8, wherein said insulating film of said MIM capacitor has a multilayer structure.

11. The cross-point memory cell according to claim 10, wherein said multilayer structure includes a high dielectric constant insulating film.

* * * * *